United States Patent [19]

Goetz

[11] Patent Number: 4,694,199
[45] Date of Patent: Sep. 15, 1987

[54] CIRCUIT ARRANGEMENT FOR PRODUCING A FLUCTUATION-FREE D-C VOLTAGE LEVEL OF A D-C VOLTAGE

[75] Inventor: Jürgen R. Goetz, Oberneuching, Fed. Rep. of Germany

[73] Assignee: Siemens Aktiengesellschaft, Berlin and Munich, Fed. Rep. of Germany

[21] Appl. No.: 853,385

[22] Filed: Apr. 16, 1986

Related U.S. Application Data

[63] Continuation of Ser. No. 422,186, Sep. 23, 1982, abandoned.

[30] Foreign Application Priority Data

Sep. 28, 1981 [DE] Fed. Rep. of Germany ....... 3138558

[51] Int. Cl.⁴ .......................... H03K 3/01; G05F 3/16
[52] U.S. Cl. .................................. 307/297; 307/304; 307/491; 323/313
[58] Field of Search ....................... 307/297, 304, 491; 323/314, 311, 318, 317, 313

[56] References Cited

U.S. PATENT DOCUMENTS

| | | | |
|---|---|---|---|
| 3,806,742 | 4/1974 | Powell | 307/297 |
| 3,823,332 | 7/1974 | Feryszka et al. | 307/297 |
| 3,975,649 | 8/1976 | Kawagoe et al. | 307/297 |
| 4,024,415 | 5/1977 | Matsuura | 307/304 |
| 4,300,061 | 11/1981 | Mihalich et al. | 307/297 |
| 4,375,596 | 3/1983 | Hoshi | 307/297 |
| 4,446,383 | 5/1984 | Concannon et al. | 307/297 |
| 4,451,744 | 5/1984 | Adam | 307/297 |
| 4,453,121 | 6/1984 | Noufer | 323/313 |

OTHER PUBLICATIONS

Askin et al., "FET Device Parameters Compensation Circuit", IBM Tech. Bulletin, vol. 14, No. 7, pp. 2088–2089, Dec. '71.
Greenberg et al., "A Bias Circuit Compensated for Threshold and Supply Variations", IBM Tech. Bulletin, vol. 16, No. 1, 6/73.

*Primary Examiner*—Stanley D. Miller
*Assistant Examiner*—Timothy P. Callahan
*Attorney, Agent, or Firm*—Herbert L. Lerner; Laurence A. Greenberg

[57] ABSTRACT

Circuit arrangement for producing a fluctuation-free d-c voltage level of a d-c supply voltage having a voltage divider of MOS transistors at the supply voltage, the voltage divider including a first series connection of a plurality of MOS transistors located in a branch between a tap for a reference voltage and a reference-potential input, and a second series connection of MOS transistors located between a d-c supply-voltage input and the reference-potential input and being driven jointly by the reference voltage at the tap of the voltage divider, the first series connection including at least four transistors, and including an MOS transistor drivingly connected to the d-c supply-voltage input and further connected in the second series connection of MOS transistors located between the d-c supply-voltage input and the reference-potential input.

3 Claims, 2 Drawing Figures

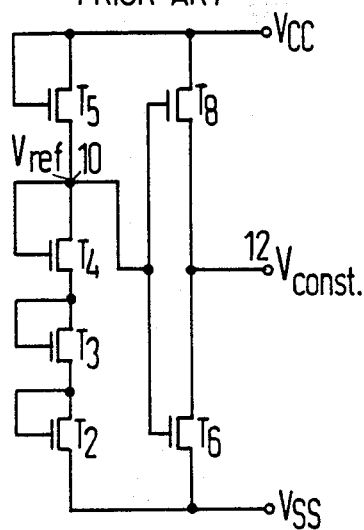
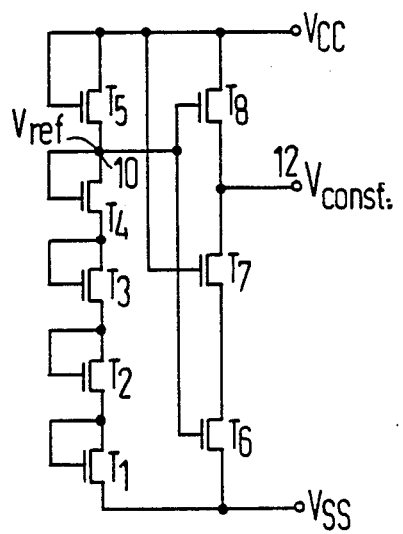

CIRCUIT ARRANGEMENT FOR PRODUCING A FLUCTUATION-FREE D-C VOLTAGE LEVEL OF A D-C VOLTAGE

This application is a continuation of application Ser. No. 422,186, filed Sept. 23, 1982, now abandoned.

The invention relates to a circuit arrangement for producing a fluctuation-free d-c voltage level of a d-c supply voltage and, more particularly, such a circuit arrangement having a voltage divider of MOS transistors between the supply voltage and the frame reference voltage wherein a series connection of a plurality of MOS transistors is located in a branch between a tap for supplying a reference voltage and a frame reference-potential input, and further having a series connection of MOS transistors located between a d-c supply-voltage input and the reference-potential input and being driven jointly by the reference voltage at the tap of the voltage divider.

A heretofore used circuit arrangement of the foregoing type is illustrated diagrammatically in FIG. 1 of the drawings. In this circuit arrangement, a voltage divider formed of MOS transistors $T_2$ to $T_5$ is located between an input of a d-c supply voltage $V_{CC}$, which, in practice, is subject to fluctuations, and an input of a reference potential $V_{SS}$. A branch of this voltage divider formed by the transistors $T_2$ to $T_4$ is located between a tap 10 for supplying a reference voltage $U_{ref}$ and an input of a frame reference potental $V_{SS}$, while another branch formed by a transistor $T_5$ is located between the tap 10 and the input of the d-c supply voltage $V_{CC}$. The transistors $T_2$ to $T_5$ of the voltage divider are all connected as resistances and as diodes, since the gate and the drain thereof are directly connected to one another. Whether a transistor $T_2$ to $T_5$ connected in this manner operates primarily as a diode or as a resistance depends upon the degree of linearity of the voltage-current characteristic thereof.

Disposed between the d-c supply voltage $V_{CC}$ and the frame reference potential $V_{SS}$ is a series connection of a pair of further MOS transistors $T_6$ and $T_8$ which are driven jointly at the gates thereof by the reference voltage $V_{ref}$ at the tap 10 of the voltage divider. A connecting point for these two transistors $T_6$ and $T_8$ is formed by an output 12 from which a substantially constant d-c voltage level $V_{const}$ may be tapped off.

When a fluctuation of the d-c supply voltage $V_{CC}$ occurs, the reference voltage $U_{ref}$ at the tap 10 of the voltage divider first fluctuates and, accordingly, also the resistance of the transistors $T_6$ and $T_8$, so that the d-c voltage level at the output 12 also fluctuates. Indeed, a d-c voltage level of 1.5 volts may be set with the circuit arrangement according to FIG. 1 from a d-c supply voltage $V_{CC}=5$ volts and a corresponding construction of the transistors. If the supply voltage $V_{CC}$ fluctuates by ±1 volt, however, the d-c voltage level at the output $V_{const}$ 12 fluctuates by ±13%, and no compensation being possible for variations in the threshold potential of the transistors $T_2$–$T_5$ since these threshold potentials depend on physical tolerance variations between the devices, also known as "technology tolerances".

It is accordingly an object of the invention to provide a circuit arrangement of the foregoing general type wherein the output d-c voltage level is even more independent of fluctuations of the d-c supply voltage and technologically conditional starting-potential variations of the MOS transistor used in the circuit arrangement.

With the foregoing and other objects in view, there is provided, in accordance with the invention, a circuit arrangement for producing a fluctuation-free d-c voltage level of a d-c supply voltage having a voltage divider of MOS transistors at the supply voltage, the voltage divider comprising a first series connection of a plurality of MOS transistors located in a branch between a tap for supplying a reference voltage and the frame reference-potential input, and a second series connection of MOS transistors located between a d-c supply-voltage input and the frame reference-potential and which are driven jointly by the reference voltage at the tap of the voltage divider, and wherein the first series connection includes at least four transistors, and also includes an MOS transistor which is drivingly connected to the d-c supply-voltage input and is connected in the second series connection of MOS transistors located between the d-c supply-voltage input and the frame reference-potential.

In accordance with a concomitant feature of the invention, the circuit arrangement comprises means for increasing the channel length of the transistors in the branch of the voltage divider which is positioned between the tap and the frame reference-potential input so as to increase the threshold starting voltage of the MOS transistors in the first series connection.

Other features which are considered as characteristic for the invention are set forth in the appended claims.

Although the invention is illustrated and described herein as embodied in a circuit arrangement for producing a fluctuation-free d-c voltage level of a d-c supply voltage, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which:

FIG. 1, as aforedescribed, is a circuit diagram of a heretofore-known circuit arrangement for producing a d-c voltage level of a d-c voltage supply which is as free as then possible of fluctuations; and FIG. 2 is a circuit diagram of an improved circuit arrangement according to the invention for producing a fluctuation-free d-c voltage level of a d-c supply voltage.

Referring now to FIG. 2 of the drawing showing the improved circuit arrangement of the invention, it is first noted that like elements therein to those in FIG. 1 are identified by the same reference characters.

As is apparent from FIG. 2, another transistor $T_1$ connected as a combined diode and a resistance, is inserted into the voltage divider, while yet another middle transistor $T_7$ is inserted into the branch formed of the transistors $T_6$ and $T_8$ and is driven by the d-c supply voltage $V_{CC}$. It follows that transistors $T_1$–$T_5$ form a first plurality of series-connected transistors, having a tap (Vref) between transistors $T_4$ and $T_5$, as shown in FIG. 2, while transistors $T_6$–$T_8$ form a second plurality of series-connected transistors, and wherein transistors $T_6$ and $T_8$ are the first and second transistors, respectively, and the transistor $T_7$ is the middle transistor. The output 12 of the circuit arrangement is formed by the connecting point of the transistors $T_7$ and $T_8$.

By increasing the number of the transistors in the voltage-divider branch between the node 10 the top reference potential and the frame reference-potential $V_{SS}$, the level of the reference voltage $V_{ref}$ at the node 10 is raised, whereby the transistor $T_5$ in the other voltage-divider branch may be made more highly resistive. A more complete stabilization of the level of the d-c voltage $U_{const}$ is thereby attained at the output 12. By further increasing the channel length of the transistors $T_1$ to $T_4$ in the voltage divider, the threshold voltage of these transistors is increased, whereby further stabilization of the reference voltage $U_{ref}$ at the node 10 is attained.

Because the transistor $T_7$ varies in resistance value thereof in accordance with fluctuations of the supply voltage $V_{CC}$, further compensation of fluctuations in the d-c supply voltage is attained, because the output d-c voltage level $V_{const}$ is raised above the transistor $T_7$ when the d-c supply voltage $V_{CC}$ drops, and is lowered when the d-c supply voltage $V_{CC}$ rises.

The transistor $T_6$, furthermore, acts to provide compensation of technology and tolerance caused variations.

With suitable dimensioning and design of the transistors, the d-c voltage level $V_{const}$ is stable during fluctuations of the d-c supply voltage to within $\pm 1$ volt or smaller than $\pm 1\%$. Furthermore, the d-c voltage level $V_{const}$ may be stabilized, for technologically dependent variations in threshold voltages that fall within a range of $-100$ mV$+V_T$ to $V_T+300$ mV, to as little or less than $\pm 1\%$, where in $U_T$ is the threshold voltage of the transistors.

The foregoing is a description corresponding to German Application No. P 31 38 558.3, dated Sept. 28, 1981, the International priority of which is being claimed for the instant application, and which is hereby made part of this application. Any discrepancies between the foregoing specification and the aforementioned corresponding German application are to be resolved in favor of the latter.

I claim:

1. Circuit arrangement for producing a fluctuation-free d-c voltage level from a fluctuating d-c supply voltage, comprising a first and a second circuit stage, the first circuit stage acting as a voltage divider having a first plurality of series connected MOS-transistors, each transistor therein having its gate connected to its drain, said first plurality of MOS-transistors being connected between the supply voltage and a frame reference potential and including a first part, a second part and a tap between said first and second parts, the second part including at least one of said first plurality of MOS-transistors and being disposed between the fluctuating supply voltage and the tap, the first part including the remainder of said first plurality of MOS-transistors and being disposed between the tap and the frame reference potential, the tap serving for supplying a tap reference potential; said second circuit stage including a second plurality of MOS-transistors located between the d-c supply voltage and said frame reference potential, the second plurality of MOS-transistors including at least a first MOS-transistor connected with its drain to the d-c supply voltage, a second MOS-transistor connected with its source to the frame reference potential and a middle MOS-transistor disposed between said first and second MOS-transistors, the first and second MOS-transistors being connected with their gates to said tap reference potential and said middle MOS-transistor being connected with its gate to the d-c supply voltage; said remainder of said first plurality of MOS-transistors including at least four of said MOS-transistors; the connection between said first MOS-transistor of said second circuit stage and said middle transistor forming the output of the circuit arrangement and producing the fluctuation-free d-c voltage level.

2. Circuit arrangement according to claim 1 wherein the transistors of said first part of the voltage divider have channel lengths greater than that of the transistor of said second part, such as to increase the threshold voltage of the MOS-transistors in said first part.

3. Circuit arrangement according to claim 1, wherein said first part includes four transistors.

* * * * *

UNITED STATES PATENT AND TRADEMARK OFFICE
CERTIFICATE OF CORRECTION

PATENT NO. : 4,694,199
DATED : September 15, 1987
INVENTOR(S) : Jürgen R. Goetz

It is certified that error appears in the above-identified patent and that said Letters Patent are hereby corrected as shown below:

Title page:

In the Title, item (54), and Column 1 Title,

"CIRCUIT ARRANGEMENT FOR PRODUCING A FLUCTUATION-FREE D-C VOLTAGE LEVEL OF A D-C VOLTAGE"

should read:

"CIRCUIT ARRANGEMENT FOR PRODUCING A FLUCTUATION-FREE D-C VOLTAGE LEVEL OF A D-C SUPPLY VOLTAGE"

Signed and Sealed this

Twenty-ninth Day of November, 1988

Attest:

DONALD J. QUIGG

Attesting Officer  Commissioner of Patents and Trademarks